US011390246B2

(12) United States Patent
Spick et al.

(10) Patent No.: US 11,390,246 B2
(45) Date of Patent: Jul. 19, 2022

(54) METHOD FOR DETECTING THE INTENTION TO LOCK OR UNLOCK A VEHICLE DOOR AND ASSOCIATED DETECTING DEVICE

(71) Applicant: VITESCO TECHNOLOGIES GMBH, Hanover (DE)

(72) Inventors: Gabriel Spick, Toulouse (FR); Vincent Marimoutou, Toulouse (FR); Steffen Eckhardt, Toulouse (FR)

(73) Assignee: VITESCO TECHNOLOGIES GMBH, Hanover (DE)

( * ) Notice: Subject to any disclaimer, the term of this patent is extended or adjusted under 35 U.S.C. 154(b) by 0 days.

(21) Appl. No.: 17/276,932

(22) PCT Filed: Sep. 18, 2019

(86) PCT No.: PCT/EP2019/075041
§ 371 (c)(1),
(2) Date: Mar. 17, 2021

(87) PCT Pub. No.: WO2020/058347
PCT Pub. Date: Mar. 26, 2020

(65) Prior Publication Data
US 2022/0032872 A1 Feb. 3, 2022

(30) Foreign Application Priority Data
Sep. 18, 2018 (FR) ...................................... 1858397

(51) Int. Cl.
*B60R 25/20* (2013.01)
*H03K 17/95* (2006.01)
(Continued)

(52) U.S. Cl.
CPC .............. *B60R 25/20* (2013.01); *B60R 25/01* (2013.01); *B60R 25/30* (2013.01); *H03K 17/9525* (2013.01); *H03K 2217/95* (2013.01)

(58) Field of Classification Search
CPC ......... B60R 25/20; B60R 25/01; B60R 25/30; H03K 17/9525; H03K 2217/95;
(Continued)

(56) References Cited

U.S. PATENT DOCUMENTS 10,385,595 B2     8/2019  Witte et al.
10,975,601 B2 *   4/2021  Beck ....................... E05B 85/10
(Continued)

FOREIGN PATENT DOCUMENTS

DE    10 2015 100 074    3/2016
WO       2017/009073     1/2017

OTHER PUBLICATIONS

International Search Report for PCT/EP2019/075041 dated Nov. 28, 2019, 5 pages.
(Continued)

*Primary Examiner* — Edwin C Holloway, III
(74) *Attorney, Agent, or Firm* — Nixon & Vanderhye

(57) ABSTRACT

Disclosed is a device for detecting intention to lock or unlock a door of a motor vehicle, the device including at least a first inductive sensor, including a first target, an oscillating circuit including a coil, a unit measuring a resonant frequency of the circuit, and a printed circuit. The device includes a second inductive sensor including: a second target in the form of a loop, such that a first end of the loop is connected to a fixed potential, and a second end of the loop is connected to a switch having two states, in a first state, the second end of the loop is connected to the fixed potential, in a second state, the second end of the loop is connected to a floating potential; and a controller for the
(Continued)

switch. The coil of the first inductive sensor is common to the second inductive sensor.

14 Claims, 5 Drawing Sheets

(51) Int. Cl.
    *B60R 25/30*     (2013.01)
    *B60R 25/01*     (2013.01)

(58) Field of Classification Search
    CPC ........... H03K 2017/9706; H03K 17/97; H03K 17/9537; G07C 2209/63; G07C 2209/64; G07C 2209/65; E05B 2047/0056; E05B 81/76; E05B 81/77; E05B 81/78
    USPC ....................................................... 340/5.72
    See application file for complete search history.

(56) References Cited

U.S. PATENT DOCUMENTS

| | | | |
|---|---|---|---|
| 2017/0016255 A1* | 1/2017 | Guibbert | B60R 25/01 |
| 2017/0260778 A1* | 9/2017 | Witte | G07C 9/00174 |
| 2018/0209182 A1* | 7/2018 | Beck | E05B 81/77 |

OTHER PUBLICATIONS

Written Opinion of the ISA for PCT/EP2019/075041 dated Nov. 28, 2019, 6 pages.

* cited by examiner

METHOD FOR DETECTING THE INTENTION TO LOCK OR UNLOCK A VEHICLE DOOR AND ASSOCIATED DETECTING DEVICE

CROSS-REFERENCE TO RELATED APPLICATIONS

This application is the U.S. national phase of International Application No. PCT/EP2019/075041 filed Sep. 18, 2019 which designated the U.S. and claims priority to FR 1858397 filed Sep. 18, 2018, the entire contents of each of which are hereby incorporated by reference.

BACKGROUND OF THE INVENTION

Field of the Invention

The invention relates to a device for detecting a user's intention to lock or unlock a motor vehicle door and to a vehicle door handle comprising said device.

Description of the Related Art

Nowadays, vehicle door handles are equipped with devices for detecting intention to lock or unlock a door. Said detection, coupled with the recognition of a "hands-free" electronic remote access control fob, carried by this user, allows the opening elements of the vehicle to be locked and unlocked remotely. Thus, when the user, carrying the corresponding electronic fob identified by the vehicle, wishes to unlock the vehicle, he touches the door handle of the vehicle and the opening elements of the vehicle are then unlocked automatically. By approaching or by pressing on a precise location of the door handle of the vehicle, called "unlocking region", the door (or alternatively all of the opening elements) is (are) unlocked without any other action from the user. Conversely, when the user, still carrying the necessary fob identified by the vehicle, wishes to lock his vehicle, he closes the door of his vehicle and he presses momentarily on another precise location of the handle, called "locking region". This movement makes it possible to lock the opening elements of the vehicle automatically.

These devices for detecting intention to lock or unlock generally comprise two inductive sensors, in the form of two moving targets each located facing a coil, and each electrically connected to respective control means contained for example in a printed circuit and each integrated into the door handle in a specific region dedicated to locking or unlocking. The targets are able to move toward their respective coil when the hand of the user comes into contact with the handle.

In general, an inductive sensor, that is to say a target and its respective coil, is dedicated to one region, that is to say one target and one coil is dedicated to detecting contact of the hand of the user in the locking region and one target and one coil is dedicated to detecting contact of the hand of the user in the unlocking region.

The control means excite the coil at what is called a resonant frequency $F_R$, for example 5 MHz, by way of an "LC" oscillating circuit, consisting of an inductor L (the coil) and at least some capacitors C. The control means in return measure the actual resonant frequency $F_B$ of the oscillating circuit, which is dependent on the distance between the target and the coil. If the actual resonant frequency $F_B$ of the circuit exceeds the resonant frequency $F_R$ and more precisely if the value of the actual resonant frequency $F_B$ exceeds a first threshold value Fs, then there is valid detection of the pressure of the hand of the user on the locking or unlocking region of the handle. The control means, in a manner known per se, comprise at least a capacitor, a frequency oscillator, as well as measuring means for measuring the resonant frequency of the LC circuit. This is known to those skilled in the art and will not be described in more detail here.

The detection device furthermore comprises a generally LF (abbreviation for "low-frequency") radiofrequency antenna. The detection device is connected to the electronic computer of the vehicle (ECU: abbreviation for "electronic control unit") and sends it a presence detection signal. The electronic computer of the vehicle has, beforehand, identified the user as being authorized to access this vehicle, or alternatively, following the reception of this presence detection signal, it performs this identification. To this end, it sends an identification request to the fob (or to the remote controller) carried by the user by way of the radiofrequency antenna. This fob in response sends its identification code to the electronic computer of the vehicle through RF (radiofrequency) waves. If the electronic computer recognizes the identification code as the one authorizing access to the vehicle, it triggers the locking/unlocking of the door (or of all of the opening elements). If, on the other hand, the electronic computer has not received any identification code or if the received identification code is erroneous, locking or unlocking is not performed.

Such vehicles are therefore equipped with door handles comprising a detection device, itself comprising a generally low-frequency radiofrequency antenna, and two inductive sensors connected to a microcontroller, integrated into a printed circuit and supplied with a voltage.

However, integrating two inductive sensors into the handle is expensive and is not a simple matter. Specifically, the space available for integrating electronic components into the handle is generally limited.

SUMMARY OF THE INVENTION

The invention proposes a method for detecting intention to lock or unlock as well as an associated detection device, having the advantage of being inexpensive and allowing a significant saving in terms of space in comparison with the solution from the prior art.

The invention proposes a device for detecting intention to lock or unlock a door of a motor vehicle, said device comprising at least a first inductive sensor, comprising a first target, an oscillating circuit comprising a coil, measuring means for measuring a resonant frequency of said circuit, and a printed circuit, said device being noteworthy in that it comprises a second inductive sensor comprising:

a second target in the form of a loop, such that a first end of the loop is connected to a fixed potential, and a second end of the loop is connected to switching means having two states:
  in a first state, the second end of the loop is connected to said fixed potential,
  in a second state, the second end of the loop is connected to a floating potential,
control means for controlling the switching means,
the coil of the first inductive sensor being common to the second inductive sensor.

In one preferred embodiment of the invention, the first target and the second target are located on either side of the printed circuit and the coil consists of a winding formed of turns that are electrically connected to one another, each located on a layer of the printed circuit.

Advantageously, the fixed potential is electrical ground.

The invention also relates to a method for detecting intention to lock or unlock a motor vehicle door, performed by a detection device comprising at least a first inductive sensor, comprising a first target, an oscillating circuit comprising a coil, measuring means for measuring a resonant frequency of said circuit, and a printed circuit, said method comprising the following steps:

fitting the detection device beforehand with a second inductive sensor comprising:
  a second target in the form of a loop, such that a first end of the loop is connected to a fixed potential, and a second end of the loop is connected to switching means having two states:
    in a first state, the second end of the loop is connected to said fixed potential,
    in a second state, the second end of the loop is connected to a floating potential,
  control means for controlling the switching means,
the coil of the first inductive sensor being common to the second inductive sensor,
positioning the switching means in the second state and performing a first measurement of an actual resonant frequency of the circuit,
positioning the switching means in the first state and performing a second measurement of an actual resonant frequency of the circuit,
calculating the measured difference between the second measurement and the first measurement,
comparing the first measurement with a first threshold,
  if the first measurement is greater than a first threshold, then
    comparing the measured difference with a second threshold,
    if the measured difference is greater than a second threshold, then detection is confirmed on the two inductive sensors, otherwise it is confirmed on the first inductive sensor,
  otherwise, if the first measurement is less than the second threshold, then:
    comparing the measured difference with a second threshold,
    if the measured difference is greater than a second threshold, then detection is confirmed on the second inductive sensor, otherwise no detection is confirmed.

Advantageously, the fixed potential is electrical ground.

The invention is also applicable to a motor vehicle door handle comprising a detection device according to any one of the features listed above.

The invention relates to any motor vehicle comprising a detection device according to any one of the features listed above.

BRIEF DESCRIPTION OF THE DRAWINGS

Other aims, features and advantages of the invention will become apparent upon reading the following description provided by way of non-limiting example and upon examining the appended drawings, in which:

FIG. 4a shows the first inductive measurement associated with the first target as a function of time t, FIG. 4b shows the second inductive measurement associated with the second target as a function of time t and FIG. 4c shows the difference between the second inductive measurement and the first inductive measurement as a function of time t, FIG. 5 schematically shows a coil of the detection device according to the invention on two printed circuit layers, a first layer 10a and a second layer 10b.

DESCRIPTION OF THE PREFERRED EMBODIMENTS

Figure 1:
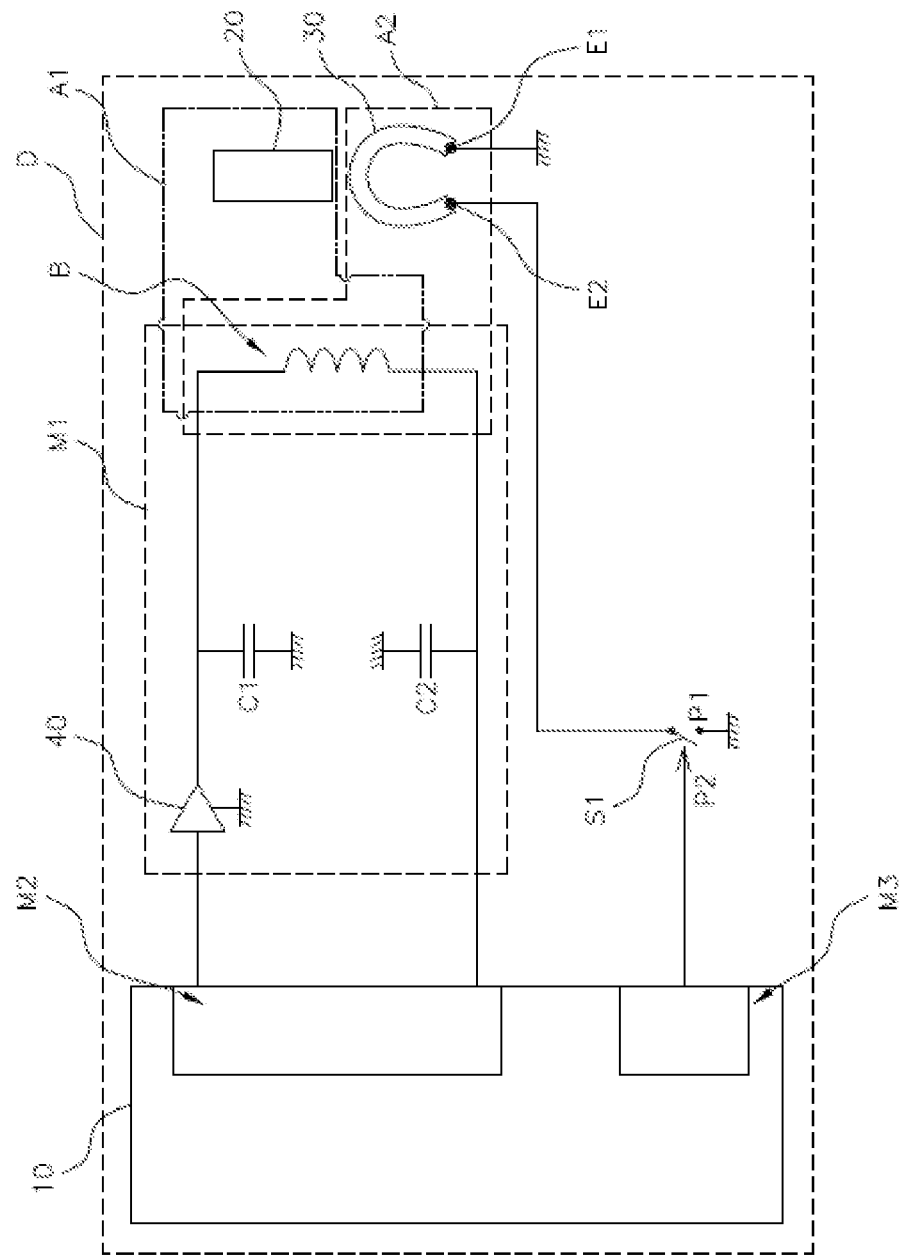
FIG. 1 is a schematic view of the device for detecting intention to lock or unlock according to the invention.

The detection device D according to the invention is illustrated in FIG. 1. The device D comprises at least a first inductive sensor A1, comprising a first target 20, a coil B, control means M1, M2 for controlling said sensor and a printed circuit 10 comprising a microcontroller (not shown).

The first target 20 is able to move toward the coil B by virtue of the user pressing on a deformable locking region S1 (or unlocking region S2) located on the outer face of the handle P.

Figure 2:
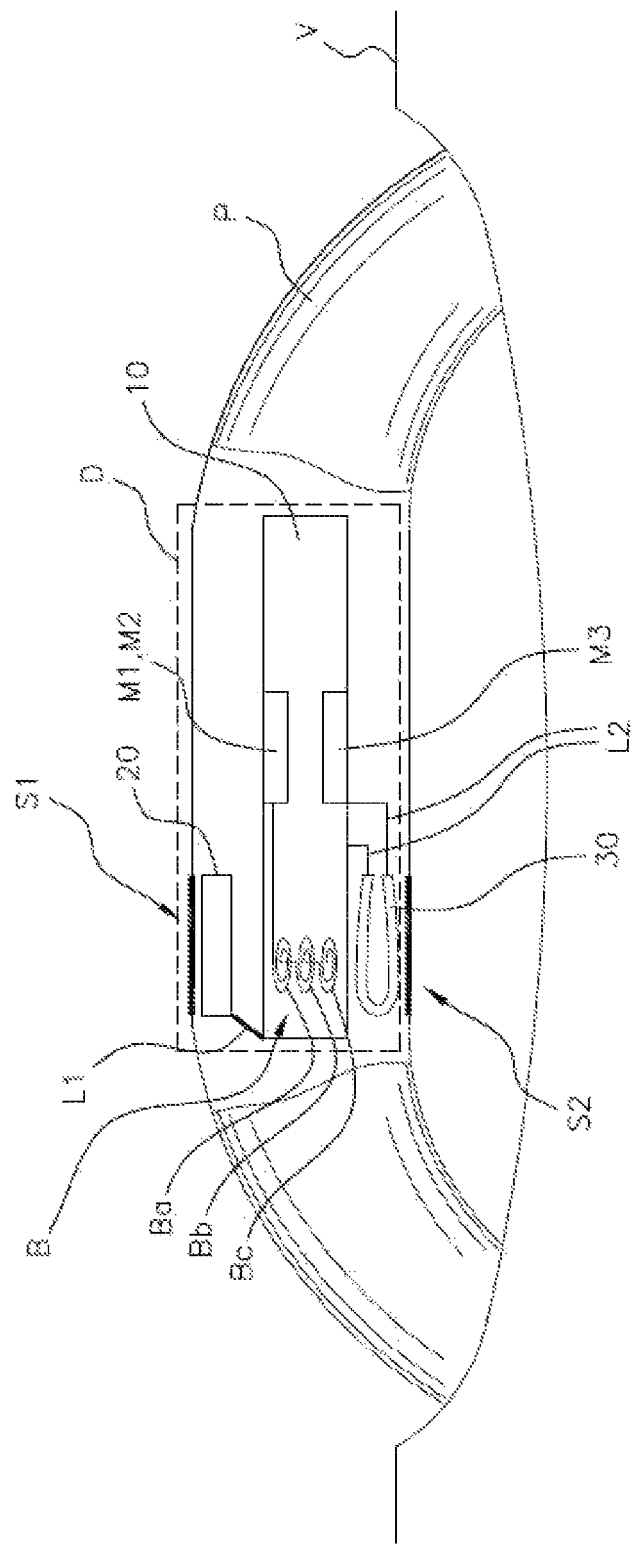
FIG. 2 is a schematic sectional view of a vehicle door handle comprising the detection device from FIG. 1.

Purely for the sake of explanation, it will be considered that the first sensor A1 is dedicated to detecting intention to lock and the target 20, located inside the handle P, is joined to a deformable locking region S1 located on the outer face of the handle P (cf. FIG. 2).

The user pressing on this locking region S1 (cf. FIG. 2), which is deformable, causes the first target 20 to move toward the coil B, and detection of intention to lock is thus confirmed.

The control means M1, M2 are in the form of:
a frequency oscillation circuit M1, or LC oscillating circuit comprising;
  capacitors C1, C2,
  an inductor L (coil B),
  an excitation means for excitation at a resonant frequency $F_R$, such as an inverting gate 40; such a circuit is known to those skilled in the art, and in the form of
a measuring circuit M2 for measuring the actual resonant frequency $F_B$ of the oscillating circuit M1, contained for example in the microcontroller located in the printed circuit 10 (cf. FIGS. 1 and 2).

According to the invention, the detection device D furthermore comprises a second inductive sensor A2, dedicated to detecting intention to unlock, itself comprising:
  a second target 30 in the form of a loop, such that a first end E1 of the loop is connected to a fixed potential, for example to electrical ground, and a second end E2 of the loop is connected to switching means S1 having two states:
    in a first state P1, the second end E2 of the loop is connected to the same fixed potential as the first end E1, for example to electrical ground,
    in a second state P2, the second end E2 of the loop is connected to a floating potential, that is to say a non-fixed potential,
  control means M3 for controlling the switching means S1.

The invention also proposes for the coil B of the first inductive sensor A1 to be common to the second inductive sensor A2. In other words, the coil is arranged such that it is located, at the same time, facing the first target 20 and facing the second target 30.

In one preferred embodiment, the first sensor A1 is dedicated to locking detection and is located in the handle P so as to detect pressing on the front face of the handle P, that is to say on the face oriented toward the outside of the vehicle V. This pressing is performed on a locking region S1 in order to lock the door of the vehicle V.

The second sensor A2, for its part, is dedicated to unlocking detection and is located in the handle P so as to detect pressing on the inner face of the handle P, that is to say on the face oriented toward the vehicle V, between the handle P and the door of the vehicle. This pressing is performed on an unlocking region S2 in order to unlock the door of the vehicle V.

The two targets 20 and 30 are located on either side of the printed circuit 10, which is located inside the handle P.

In this preferred embodiment of the detection device D according to the invention, the coil B consists of multiple planar windings, along the plane of the printed circuit 10. A winding consists of concentric turns. If the printed circuit 10 comprises multiple layers, then it is possible for a winding formed of turns of the coil B to be located on each layer, this being illustrated in FIG. 5. It is also possible, according to the invention, to have only one winding, or only two windings formed of turns on one or two layers of a printed circuit 10, said printed circuit 10 comprising at least two layers.

Figure 5:
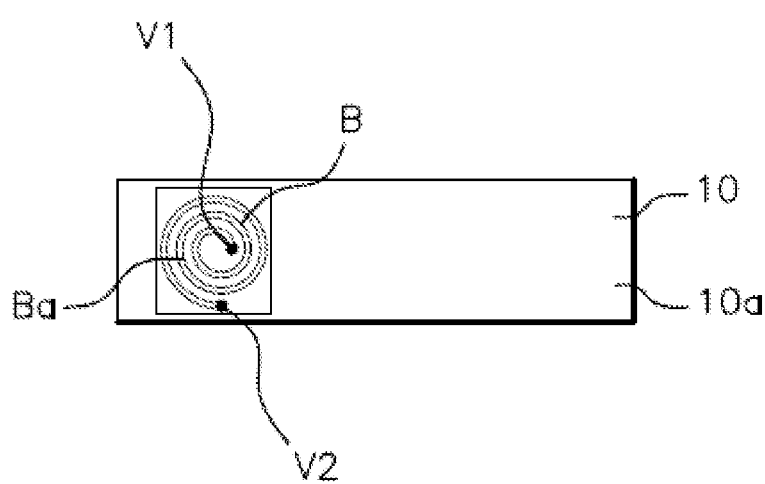
Figure 5:
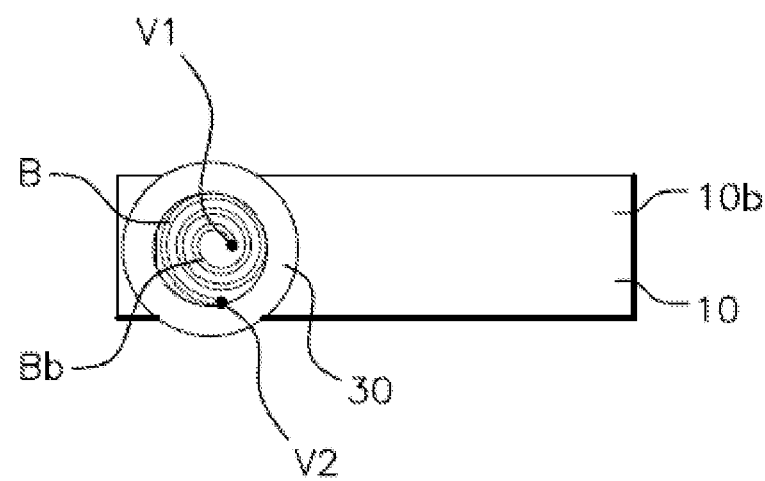

In FIG. 5, the printed circuit 10 consists of two layers 10a and 10b. A first winding Ba of the coil B is located on a first layer 10a. A second winding Bb of the coil B is located on a second layer 10b. The first winding Ba and the second winding Bb are preferably identical, without this being limiting, and electrically connected to one another by way of two vias V1 and V2 passing through the first layer 10a and the second layer 10b. At least one winding, for example the first winding Ba, is located facing the first target 20 (not shown in FIG. 5) and at least one winding, for example the second winding Bb, is located facing the second target 30 (cf. FIG. 5).

The printed circuit 10 may of course consist of a plurality of layers; in this case, according to the invention, each layer may comprise a winding formed of turns of the coil B. Said windings are connected to one another so as to form a single coil B common to the two targets 20, 30 and therefore common to the two sensors A1, A2.

The coil B consists of windings on one or more printed circuit 10 layers, so as to have at least one winding facing the first target 20 and at least one winding facing the second target 30. The actual resonant frequency $F_B$ of the oscillating circuit M1 therefore varies depending on the distance between the first target 20 and the coil B, but also depending on the distance between the second target 30 and the coil B.

A "loop" is understood to mean a target A2 having the form of an open loop, an arc of a circle, a rounded shape, whose two ends, the first end E1 and the second end E2, do not meet or are not electrically connected to one another (cf. FIG. 1).

A "floating" potential is understood to mean a potential that is not connected to any fixed potential. The second end E2, in the second state P2, is in this case connected to a potential that may take any value.

The switching means S1 are for example in the form of a switch or a transistor.

The control means M3 for controlling the switching means S1 are for example in the form of software integrated into the microcontroller located in the printed circuit 10.

Figure 3:
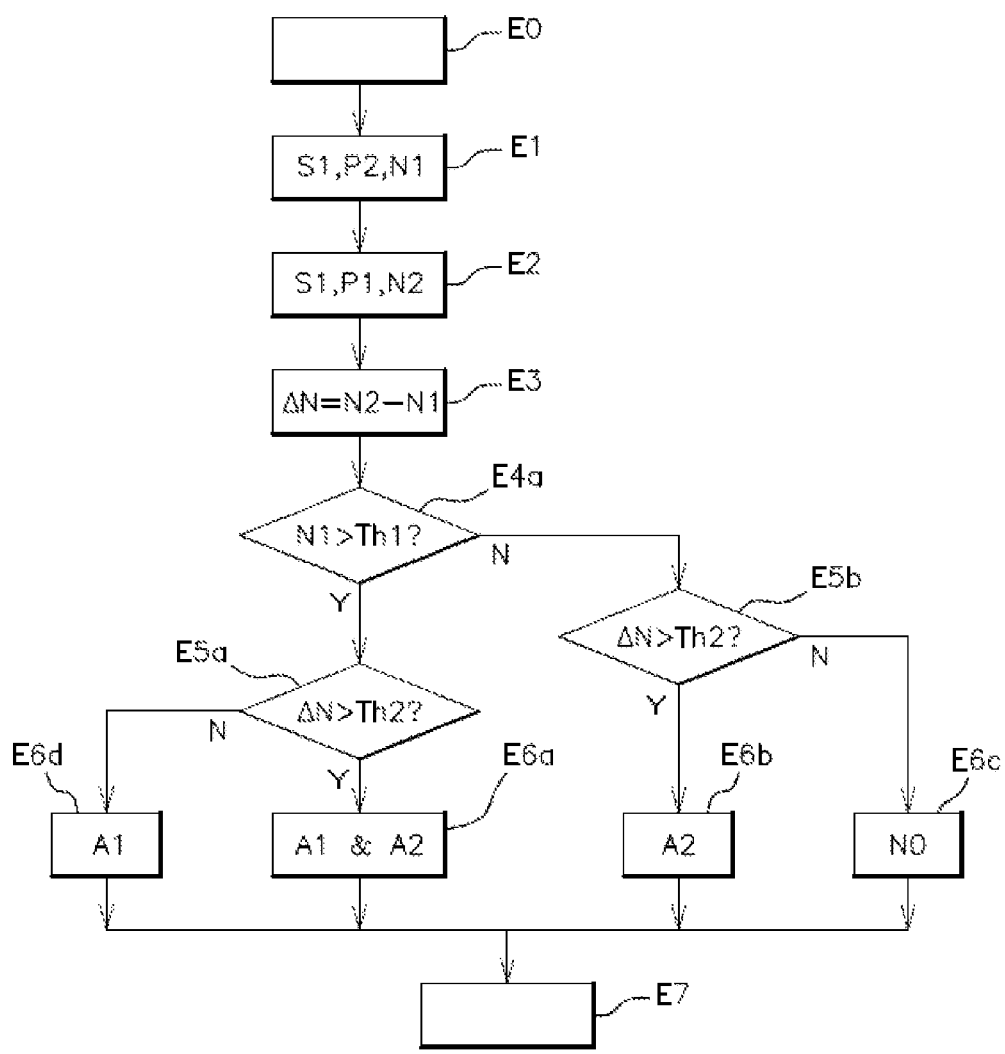
FIG. 3 is a flowchart illustrating the method for detecting intention to lock or unlock according to the invention.

The method for detecting intention to lock or unlock a motor vehicle V door, illustrated in FIG. 3, will now be described:

In a preliminary step (step E0, cf. FIG. 3), the detection device D is fitted with the second inductive sensor A2 as described above.

The switching means S1 are then positioned (step E1) in the second state P2, such that the second end E2 of the second target 30 is electrically connected to a floating potential.

In this configuration, the second target 30 no longer functions as target of the second inductive sensor A2. Specifically, in this configuration, the electric current is not able to flow in the second target 30 in the form of a loop, and there is therefore no current induced in the second target 30, so this is not able to act on the electromagnetic field from the coil B. As a result, if the actual resonant frequency $F_B$ of the LC circuit varies, this is not due to a movement of the second target 30 with respect to the coil B, but due only to the movement of the first target 20 toward the coil B.

In this configuration in which the switching means S1 are in the second state P2, the detection device is configured so as to detect pressing on the first inductive sensor A1, that is to say pressing on the locking region S1.

A first measurement of the actual resonant frequency $F_B$ of the LC circuit is then performed, this being called N1.

Next, in a second step E2, the switching means S1 are positioned in the first state P1, such that the second end E2 of the second target 30 is electrically connected to the same potential as the first end E1, for example to electrical ground.

In this configuration, the second target 30 functions as target of the second inductive sensor A2. The first target A1, for its part, always functions as target of the first inductive sensor A1, regardless of the configuration of the switching means S1.

A second measurement of the actual resonant frequency $F_B$ of the LC circuit is then performed, this being called N2.

The detection method according to the invention is based on the assumption that, between the first measurement N1 and the second measurement N2, the position of the first target 20 with respect to the coil B and the position of the second target 30 with respect to the coil B do not change. The first measurement N1 and the second measurement N2 are therefore performed very quickly, and the switching of the switching means S1 between the second state P2 and the first state P1 is also very fast, of the order of a few μs or ms.

In the following step (step E3), the difference between the second measurement N2 and the first measurement N1 of the actual resonant frequency of the LC circuit is calculated, that is to say:

$$\Delta N = N2 - N1$$

Next, the method according to the invention proposes to compare the first measurement N1 with a first threshold Th1 (step E4a).

If the first measurement N1 is greater than the first threshold Th1, then the measured difference ΔN is compared with a second threshold Th2 (step E5b).

If the measured difference ΔN is greater than the second threshold Th2, then detection is confirmed on the two inductive sensors A1, A2 (step E6a), if the measured difference ΔN is less than the second threshold Th2, then detection is confirmed on the two inductive sensors A1, A2, then detection is confirmed on the first inductive sensor A1 (step E6d).

Otherwise, if the first measurement N1 is less than the first threshold Th1, then the measured difference ΔN is compared with a second threshold Th2 (step E5b).

If the measured difference ΔN is greater than the second threshold Th2, then detection is confirmed on the second inductive sensor A2 (step E6b), if the measured difference ΔN is less than the second threshold Th2, then no detection is confirmed, neither on the first inductive sensor A1 nor on the second inductive sensor A2 (step E6c).

The method is of course repeated after each detection. The switching means S1 switch between the second state P2 and the first state P1 at a fixed frequency.

The detection method may be initiated and started when a compatible user fob has been identified around the vehicle V, and the detection method may be put on standby when no compatible user fob has been identified within a radius around the vehicle V.

Figure 4:
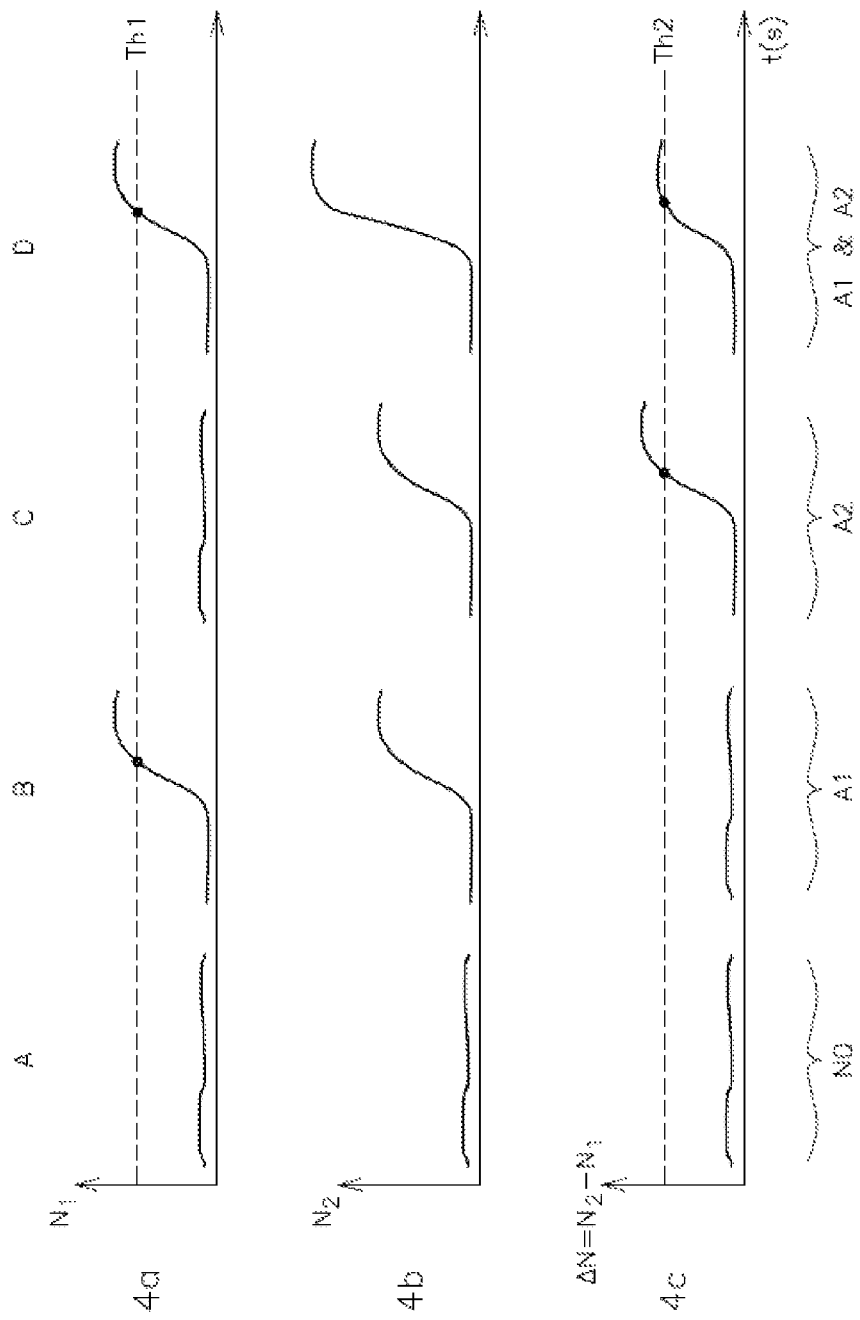
FIG. 4 illustrates the variations in inductive measurements in four combinations of positions A, B, C, D of the two targets and the corresponding detection.

FIG. 4 illustrates the variation in the first measurement N1, in the second measurement N2 and in the measured difference ΔN for the four possible detection cases, A, B, C, D as a function of time t, where:

Case "A" corresponds to the absence of detection: no intention to lock or unlock is detected, there is no pressing by the user.

Case "B" corresponds to confirmation of detection on the first inductive sensor A1, therefore to intention to lock.

Case "C" corresponds to confirmation of detection on the second inductive sensor A2, therefore to intention to unlock.

Case "D" corresponds to confirmation on the two inductive sensors A1 and A2, and therefore corresponds to the case in which a user would press on the two regions, locking region or unlocking region, at the same time, which may correspond for example to confirmation of another function, such as closing the windows at the same time as locking the car, or to internal locking of the vehicle V.

FIG. 4a shows the variations in the first measurement N1 for the four cases A, B, C and D.

FIG. 4b shows the variations in the second measurement N2 for the four cases A, B, C and D.

FIG. 4c shows the variations in the measured difference ΔN for the four cases A, B, C and D.

For case A:

The first measurement N1 is less than the first threshold Th1 and the measured difference ΔN is less than the second threshold Th2.

For case B:

The first measurement N1 is greater than the first threshold Th1 and the measured difference ΔN is less than the second threshold Th2.

For case C:

The first measurement N1 is less than the first threshold Th1 and the measured difference ΔN is greater than the second threshold Th2.

For case D:

The first measurement N1 is greater than the first threshold Th1 and the measured difference ΔN is greater than the second threshold Th2.

The invention therefore expediently makes it possible to integrate two inductive sensors into a door handle, each sensor being dedicated to intention to lock or unlock the door, in a manner that is optimized (a single LC circuit), inexpensive and robust.

The invention is ingenious in that a distinction is drawn between the detections (locking, unlocking, both, or no detection) by way of a specific design of a target of one of the two sensors (in the form of a loop), one end of which is connected in a specific manner to (fixed or floating) potentials allowing said sensor to play an active role as an inductive or passive sensor, that is to say that the target then no longer allows inductive detection.

The invention claimed is:

1. A device (D) for detecting intention to lock or unlock a door of a motor vehicle, said device (D) comprising at least a first inductive sensor (A1), comprising a first target (20), an oscillating circuit (M1) comprising a coil (B), measuring means for measuring a resonant frequency of said circuit (M2), and a printed circuit (10), said device (D) further comprising a second inductive sensor (A2) comprising:
    a second target (30) in the form of a loop, such that a first end (E1) of the loop is connected to a fixed potential, and a second end (E2) of the loop is connected to switching means (S1) having two states:
    in a first state (P1), the second end (E2) of the loop is connected to said fixed potential,
    in a second state (P2), the second end (E2) of the loop is connected to a floating potential,
    control means (M3) for controlling the switching means (S1),
    the coil (B) of the first inductive sensor (A1) being common to the second inductive sensor (A2).

2. The detection device (D) as claimed in claim 1, wherein the first target (20) and the second target (30) are located on either side of the printed circuit (10) and wherein the coil (B) consists of a winding formed of turns (Ba, Bb) that are electrically connected to one another, each located on a layer (10a, 10b) of the printed circuit.

3. The detection device (D) as claimed in claim 2, wherein the fixed potential is electrical ground.

4. A motor vehicle door handle (P), comprising a detection device (D) as claimed in claim 2.

5. A motor vehicle (V), comprising the detection device (D) as claimed in claim 2.

6. A motor vehicle door handle (P), comprising a detection device (D) as claimed in claim 3.

7. A motor vehicle (V), comprising the detection device (D) as claimed in claim 3.

8. The detection device (D) as claimed in claim 1, wherein the fixed potential is electrical ground.

9. A motor vehicle door handle (P), comprising a detection device (D) as claimed in claim 8.

10. A motor vehicle (V), comprising the detection device (D) as claimed in claim 8.

11. A motor vehicle door handle (P), comprising the detection device (D) as claimed in claim 1.

12. A motor vehicle (V), comprising the detection device (D) as claimed in claim 1.

13. A method for detecting intention to lock or unlock a motor vehicle door, performed by a detection device (D) comprising at least a first inductive sensor (A1), comprising a first target (20), an oscillating circuit (M1) comprising a coil (B), measuring means for measuring a resonant frequency of said circuit (M2), and a printed circuit (10), said method comprising:
    fitting the detection device (D) beforehand with a second inductive sensor (A2) comprising:
    a second target (30) in the form of a loop, such that a first end (E1) of the loop is connected to a fixed potential, and a second end (E2) of the loop is connected to switching means (S1) having two states:
    in a first state (P1), the second end (E2) of the loop is connected to said fixed potential,
    in a second state (P2), the second end (E2) of the loop is connected to a floating potential,
    control means (M3) for controlling the switching means (S1), the coil (B) of the first inductive sensor (A1) being common to the second inductive sensor (A2), positioning the switching means (S1) in the second state (P2) and performing a first measurement (N1) of an actual resonant frequency of the circuit (M1), positioning the switching means (S1) in the first state (P1) and performing a second measurement (N2) of an actual resonant frequency of the circuit (M1), calculating the measured difference ($\Delta N$) between the second measurement (N2) and the first measurement (N1), comparing the first measurement (N1) with a first threshold (Th1), if the first measurement (N1) is greater than a first threshold (Th1), then comparing the measured difference ($\Delta N$) with a second threshold (Th2), if the measured difference ($\Delta N$) is greater than a second threshold (Th2), then detection is confirmed on the two inductive sensors (A1, A2), otherwise it is confirmed on the first inductive sensor (A1), otherwise, if the first measurement (N1) is less than the second threshold (Th1), then:

comparing the measured difference ($\Delta N$) with a second threshold (Th2), if the measured difference ($\Delta N$) is greater than a second threshold (Th2), then detection is confirmed on the second inductive sensor (A2), otherwise no detection is confirmed.

14. The detection method as claimed in claim 13, wherein the fixed potential is electrical ground.

* * * * *